US012687735B2

(12) United States Patent　　　　(10) Patent No.: US 12,687,735 B2

Chow et al.　　　　(45) Date of Patent: Jul. 21, 2026

(54) MASK AND LED MODULE

(71) Applicant: Shenzhen Time Waying Technology Co., Ltd., Shenzhen (CN)

(72) Inventors: Wingyip Kenny Chow, Shenzhen (CN); Yanlong Li, Shenzhen (CN)

(73) Assignee: Shenzhen Time Waying Technology Co., Ltd., Shenzhen (CN)

( * ) Notice: Subject to any disclaimer, the term of this patent is extended or adjusted under 35 U.S.C. 154(b) by 352 days.

(21) Appl. No.: 18/223,538

(22) Filed: Jul. 18, 2023

(65) Prior Publication Data

US 2023/0359060 A1　　Nov. 9, 2023

Related U.S. Application Data

(63) Continuation of application No. PCT/CN2022/072750, filed on Jan. 19, 2022.

(30) Foreign Application Priority Data

Jan. 19, 2021　(CN) ......................... 202120142619.1
Jan. 19, 2021　(CN) ......................... 202120142690.X
Jan. 19, 2021　(CN) ......................... 202120150652.9

(51) Int. Cl.
| | |
|---|---|
| *G02B 30/25* | (2020.01) |
| *G02B 5/28* | (2006.01) |
| *G02B 5/30* | (2006.01) |
| *H01L 25/16* | (2023.01) |
| *H10W 90/00* | (2026.01) |

(52) U.S. Cl.
CPC ............. *G02B 30/25* (2020.01); *G02B 5/286* (2013.01); *G02B 5/3025* (2013.01); *H10W 90/00* (2026.01)

(58) Field of Classification Search
CPC . G02B 30/25; G02B 5/00; G02B 5/28; G02B 5/30; G02B 5/286; G02B 5/003; G02B 5/3025; G02B 27/09; G02B 27/0988; H01L 25/167; H01L 25/16; H01L 25/075; H01L 25/0753; H01L 33/485; H01L 33/502; H01L 33/62; H10H 20/855; H10H 20/857; H10H 20/856; H10H 20/8512; H10H 20/8583; H10H 29/10
USPC ....... 359/464–466, 469, 475, 477, 458, 376; 348/42, 51, 58
See application file for complete search history.

(56) References Cited

U.S. PATENT DOCUMENTS

| | | | | |
|---|---|---|---|---|
| 2005/0035353 A1* | 2/2005 | Adachi | .................. | H10D 86/00 257/E27.111 |
| 2018/0059429 A1* | 3/2018 | Huber | .................... | H10H 29/10 |

FOREIGN PATENT DOCUMENTS

| | | |
|---|---|---|
| CN | 110969955 A | 4/2020 |
| CN | 211348878 U | 8/2020 |

OTHER PUBLICATIONS

International Search Report of PCT Patent Application No. PCT/CN2022/072750 issued on Apr. 18, 2022.

* cited by examiner

*Primary Examiner* — Jie Lei

(57) ABSTRACT

A mask (3), an LED module and a display screen, wherein the mask (3) is integrally in a grid structure and includes a plurality of grid units (31), each grid unit (31) is enclosed by a retaining wall (311), one end of the retaining wall (311) extends outwards the direction close to the center of the grid unit (31) and is provided with a support edge (312), and the outer side of the support edge (312) is provided with a support plane.

6 Claims, 3 Drawing Sheets

MASK AND LED MODULE

CROSS REFERENCE TO RELATED APPLICATIONS

The present application is a Continuation application of PCT Application No. PCT/CN2022/072750, filed Jan. 19, 2022, which claims the priorities of Chinese patent application No. 202120150652.9, entitled "LED DISPLAY MODULE AND DISPLAY SCREEN" and filed on Jan. 19, 2021, Chinese patent application No. 202120142619.1, entitled "LED MODULE AND DISPLAY SCREEN" and filed on Jan. 19, 2021, and Chinese patent application No. 202120142690.X, entitled "MASK AND LED MODULE" and filed on Jan. 19, 2021, the entire contents of which are hereby incorporated by reference.

TECHNICAL FIELD

The present application relates to the technical field of display devices, and in particular to a mask, an LED module and a display screen.

BACKGROUND 3D display devices generally include an LED emitting unit and a polarizer. The polarizer is arranged at an emitting side of the LED emitting unit. Light emitted by the LED emitting unit passes through the polarizer to obtain a light with a specific polarization direction. Observer's left and right eyes can respectively see lights with different polarization directions, thus to observe a 3D display effect.

In the related arts, positions of the polarizer and the LED emitting unit need to be fixed relative to each other. However, in the related arts, positions of the polarizer and the LED emitting unit cannot be maintained accurately and stably for the structural form.

In the related arts, a light output efficiency of an LED module used in the 3D display device is low, which affects a display effect thereof.

In the related arts, the polarizer is generally formed integrally as one piece and placed at a side with the LED emitting unit. However, such manner on one aspect may easily make some areas of the polarizer unable to align with corresponding LED emitting unit, resulting in poor polarizing effect; and on the other aspect uses a lot of polarizing materials and has a high cost.

SUMMARY OF THE INVENTION

Technical Solution

According to embodiments of the present application, a mask, an LED module and a display screen are provided.

Applying for a mask, which is integrally in a grid structure and includes a plurality of grid units, each of the plurality of grid units being enclosed by a retaining wall, one end of the retaining wall extending outwards along a direction close to a center of the grid unit to form a support edge, an outer side of the support edge being provided with a support plane.

An LED module includes a substrate, LED emitting units, a mask as described above and a polarizer, the mask is arranged between the substrate and the polarizer, and the LED emitting units are arranged within the grid units of the mask, respectively.

An LED module includes a substrate, a plurality of LED emitting units, a mask and a polarizer, the plurality of LED emitting units are arranged at a side of the substrate, the mask includes a plurality of grid units mounted around the plurality of LED emitting units, respectively, the polarizer includes first and second polarizers, light emitted by the plurality of LED emitting units passes through the first polarizers to form a first polarized light or passes through the second polarizers to form a second polarized light, each of the plurality of grid units is attached with the first polarizer or the second polarizer, each of the first polarizers is neighboring to at least one of the second polarizers, and each of the second polarizers is neighboring to at least one of the first polarizers An LED module includes a substrate, a plurality of LED emitting units, a mask and a polarizer, the plurality of LED emitting units is provided at a side of the substrate, the mask includes a plurality of grid units mounted around the plurality of LED emitting units, respectively; the polarizer includes first circular polarizers, second circular polarizers and a third polarizer, the third polarizer is a reflective polarizer with a reflective surface thereof facing towards the plurality of LED emitting units, a portion of a side of the reflective polarizer away from the plurality of LED emitting units corresponding to each of the plurality of LED emitting units is provided with the first circular polarizer or the second circular polarizer; the first circular polarizers and the second circular polarizers are circular polarizers and opposite in polarization directions, light emitted by the LED emitting unit is converted into left circularly polarized light after passing through the first circular polarizers or converted into right circularly polarized light after passing through the second circular polarizer.

A display screen includes any one of the LED modules described above.

Beneficial Effects

Compared with the related arts, the mask and LED module of this application has the following beneficial effects:

The grid unit of the present application includes the retaining wall and the support edge, and the support edge is provided with the support plane, the mask may be used to cover a side of the LED module with the LED emitting units, and the grid unit may be mounted around the LED emitting unit, wherein the support plane of the support edge may be used to attach the polarizer thereon, thereby ensuring a position relationship between the polarizer and the LED emitting unit.

The polarizer of the present application adopts a non-integral design, and the first and second polarizers correspond to the grid units, which can better ensure the polarizing effect and reduce the use of polarizing materials to reduce material costs.

The third polarizer of the present application adopts a reflective polarizer, and the first and second circular polarizers can achieve circular polarizing function. Therefore, it can improve the light output efficiency and display effect on the basis of achieving 3D display effect.

Figure 1:
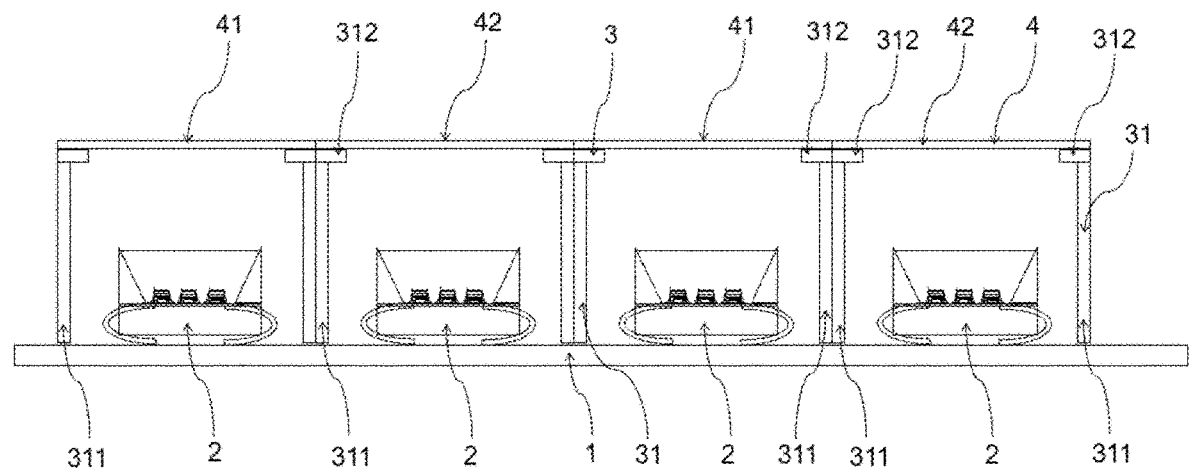
FIG. 1 is a schematic view of an LED module of first and second embodiments of the present application.

In the drawings, the reference signs represent:
1 substrate;
2 LED emitting unit;
3 mask;
31 grid unit;
311 retaining wall;
312 support edge;
4 polarizer;
41 first polarizer;
42 second polarizer;
43 third polarizer.

DESCRIPTION OF THE EMBODIMENTS

In order to make the objects, technical embodiments and advantages of the present application clearer, the present application will be clearly and completely described with reference to the drawings and embodiments. It should be understood that the specific embodiments described here are only used to explain the present application and not intended to limit the present application.

The First Embodiment

Figure 2:
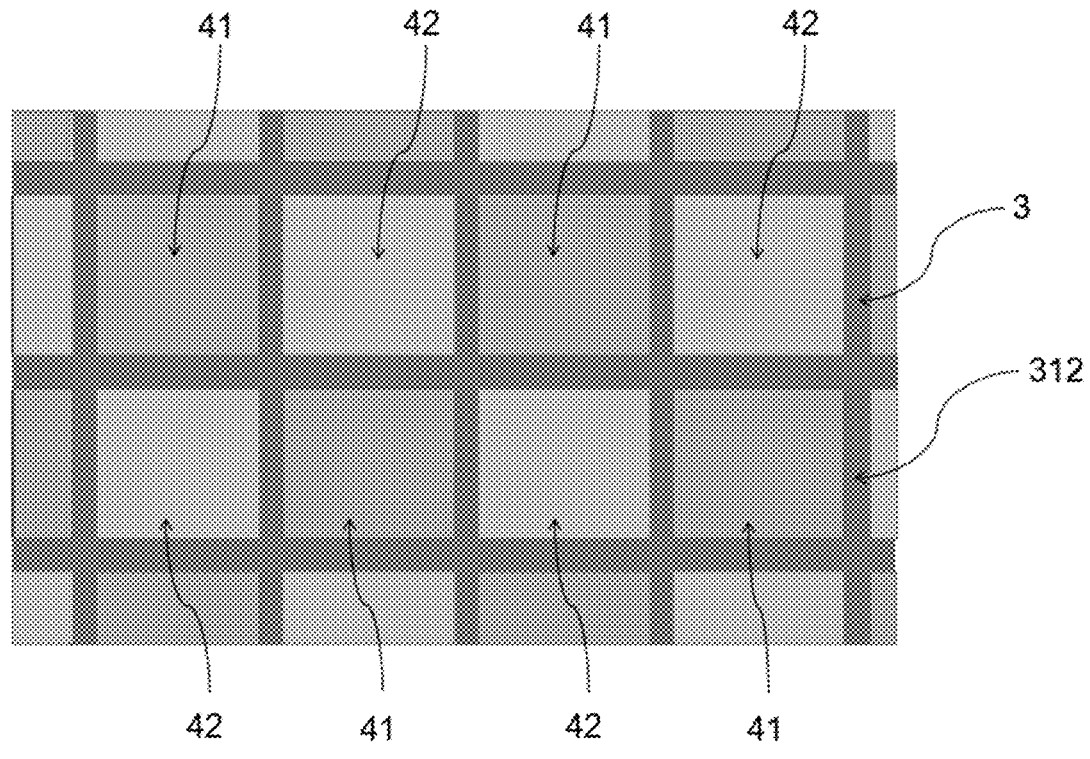
FIG. 2 is a schematic view of construction and arrangement of a kind of polarizer of the LED module of the first, second and third embodiments of the present application.

In this embodiment, as shown in FIGS. 1-2, an LED module includes a substrate 1, a plurality of LED emitting units 2, a mask 3, and a polarizer 4. The mask 3 is arranged between the substrate 1 and the polarizer 4. The mask 3 is integrally in a grid structure, and includes a plurality of grid units 31. Each of the grid units 31 is enclosed by a retaining wall 311. One end of the retaining wall 311 extends outwards along a direction close to a center of the grid unit 311 to form a support edge 312. An outer side of the support edge 312 is provided with a flat support plane. The LED emitting units 2 are arranged inside the grid units 31 of the mask 3, respectively.

In this embodiment, the grid unit 31 includes the retaining wall 311 and the support edge 312, the support edge 312 is provided with the support plane, the mask 3 may be used to cover a side of the LED module with the LED emitting units 2, and the grid unit 31 may be mounted around the LED emitting unit 2, wherein the support planes of the support edges 312 may be used to attach the polarizer 4 thereon, ensuring that a position relationship between the polarizer 4 and the LED emitting units 2 is accurate, and a connection between the polarizer 4 and the support edges 312 is stable.

In this embodiment, the support planes at outer sides of the support edges 312 of the grid units 31 are located in a same plane, thereby facilitating the installation and fixation of the polarizer 4.

The retaining walls 311 are formed separately or integrally. Specifically, when the retaining walls 311 are formed separately, each LED emitting unit 2 corresponds to a separate retaining wall 311. During assembly, each LED emitting unit 2 is equipped with a retaining wall 311 therearound, and the retaining walls 311 corresponding to neighboring LED emitting units 2 abut each other. When the retaining walls 311 are formed integrally, neighboring retaining walls 311 are connected integrally as one piece. In this way, the mask 3 is an integral structure. As long as the mask 3 is positioned with the substrate 1, each of the retaining walls 311 can be mounted around one corresponding LED emitting unit 2 to ensure an accuracy of the position, which is more convenient and efficient for assembly, thereby improving assembly efficiency.

The retaining wall 311 and the support edge 312 may be formed separately or connected integrally. Specifically, when the retaining wall 311 and the support edge 312 are formed separately, it means that the retaining wall 311 and the support edge 312 are separate structures, which may be divided into several situations, for example:
1. all of the retaining walls 311 are connected integrally, and all of the support edges 312 are connected integrally and correspond to positions of the retaining walls 311 one by one. During assembly, the support edges 312 are covered on a side of the retaining walls 311 away from the substrate 1 and positioned, so as to ensure the corresponding relationship between all of the support edges 312 and retaining walls 311, so that assembly is convenient and fast.
2. all of the retaining walls 311 are separate structures, and all of the support edges 312 are separate structures. In this case, the support edges 312 need to be assembled to the retaining walls 311 one by one.
3. all of the retaining walls 311 are separate structures, and all of the support edges 312 are connected integrally. Firstly, the retaining walls 311 are assembled to the substrate 1, and then the support edges 312 are assembled to the substrate 1, so as to make the support edges 312 correspond with the retaining walls 311.

When the retaining walls 311 and the support edges 312 are connected integrally, the setting method of separate or integral grid units 31 may be referred to, and the retaining walls 311 and the support edges 312 may be treated as a whole.

In this embodiment, the retaining wall 311 is made of light absorbing materials or light reflective materials; or, a light absorbing film or a light reflective film is provided on an inner face of the retaining wall 311. The retaining wall 311 can block the light emitted by the LED emitting unit 2 from shining towards neighboring LED emitting units 2, thereby preventing mutual interference between neighboring LED emitting units 2 and ensuring the display effect. In addition, the retaining walls 311 and the support edges 312 may cooperatively achieve the fixation and support of the polarizer 4, ensuring the reliability of the LED module.

In this embodiment, a side of the support edge 312 away from the substrate 1 is flat, and the polarizer 4 may be adhered to the support edge 312 through optical adhesive bonding, thereby achieving stable adhesion. In some embodiments, a positioning groove may be provided on the side of the support edge 312 away from the substrate 1, the support plane is located at a bottom of the positioning groove, and the polarizer 4 is attached into the positioning groove and may be flush with an opening of the positioning groove. In some embodiments, a limiting edge may protrude from the support plane of the support edge 312, a periphery of the polarizer 4 abuts a lateral side of the limiting edge, and the polarizer 4 may be flush with a top side of the limiting edge. By means of matching the polarizer 4 with the positioning groove or the limiting edge, a position accuracy of the polarizer 4 can be ensured when it is attached onto the support edge 312, and thus the position accuracy between the polarizer 4 and the LED emitting units 2 are improved, thereby improving the display quality of the LED module. During forming the positioning groove or the limiting edge, its shape and size may be set adaptively according to the shape, size, thickness, etc. of the polarizer 4.

An inner face of the retaining wall 311 may be provided with reinforced ribs that are connected to the support edge 312. Specifically, the reinforced ribs may be arranged along a periphery of an open side of the retaining wall 311 adjacent to the support edge 312 and spaced from each other. Further, the reinforced ribs are perpendicular to the inner face of the retaining wall 311, and preferably, are evenly spaced from each other. The reinforced ribs may be triangular-shaped. When the retaining wall 311 and the support edge 312 are formed separately, the reinforcing ribs abut against an inner side of the support edge 312. When the retaining wall 311 and the support edge 312 are formed integrally, the reinforcing ribs are connected to the support edge 312 integrally.

In this embodiment, a periphery of a side of the retaining wall 311 away from the substrate 1 extends inwardly to form the support edge 312, and the support edge 312 of the same grid unit 31 forms an annular structure. The support edge 312 has a central axis that coincides with that of the retaining wall 311. A projection area of the support edge 312 of each grid unit 31 is less than 20% of the area of the corresponding grid unit 31, for example may be 19%, 18%, 17%, 16%, 15%, 14%, 13%, 12%, 11%, 10%, 5%, etc., ensuring the stability of support while also ensuring the amount of light output. Specifically, in the present application, a cross-section of the grid unit 31 is square-shaped, and the retaining wall 311 is a square ring structure. Correspondingly, the support edge 312 is also a square ring structure and extends inwardly. In some embodiments, the retaining wall 311 may be a rectangular ring structure, and correspondingly the support edge 312 is a rectangular ring structure too. In some embodiments, the retaining wall 311 may be a circular ring structure, and correspondingly the support edge 312 is a circular ring structure too. The shape of the retaining wall 311 and the shape of support edge 312 may be set adaptively according to actual situation, which are not restricted here.

The polarizer 4 includes first polarizers 41 and second polarizers 42. Light emitted by the LED emitting unit 2 passes through the first polarizer 41 to form a first polarized light, or passes through the second polarizer 42 to form a second polarized light. Polarization directions of the first polarizer 41 and the second polarizer 42 are different from each other. Each of the LED emitting units 2 is correspondingly provided with the first polarizer 41 or the second polarizer 42, each first polarizer 41 is neighboring to at least two of the second polarizers 42, and each second polarizer 42 is neighboring to at least two first polarizers 41. In this embodiment, when the first polarizer 41 and the second polarizer 42 both are linear polarizers, the polarization directions of the first polarizer 41 and the second polarizer 42 are perpendicular to each other; when the first polarizer 41 and the second polarizer 42 are circular polarizers, the first polarizer 41 and the second polarizer 42 may be left circularly polarized and right circularly polarized, respectively. Specifically, in conjunction with FIG. 2, the first polarizers 41 and the second polarizers 42 are arranged alternately in first and second directions, wherein the first direction is perpendicular to the second direction. That is, the first polarizers 41 and the second polarizers 42 each are grid-shaped, corresponding to the LED emitting unit 2. The first polarizers 41 and the second polarizers 42 may both be rectangular-shaped or square-shaped, with the second polarizers 42 arranged at four lateral sides of each first polarizer 41 and the first polarizers 41 arranged at four lateral sides of each second polarizer 42. The first polarizers 41 are continuously arranged in the first direction, the second polarizers 42 are continuously arranged in the first direction, and the first polarizers 41 and the second polarizers 42 are alternately arranged in the second direction. That is, both the first polarizers 41 and the second polarizers 42 are strip-shaped. When both the first polarizers 41 and the second polarizers 42 extend in the longitudinal direction, the first polarizers 41 and the second polarizers 42 are alternately arranged in the lateral direction. When both the first polarizers 41 and the second polarizers 42 extend in the lateral direction, the first polarizers 41 and the second polarizers 42 are alternately arranged in the longitudinal direction.

In this embodiment, an injection mold is further provided for molding the mask 3 described above. The injection mold includes a first template and a second template. When the first template and the second template are combined, a mold cavity is formed therebetween. The mold cavity includes a first cavity and a second cavity. The first cavity matches with the retaining wall 311, and the second cavity communicates with the first cavity and matches with the support edge 312. By means of the above injection mold, the retaining wall 311 may be formed by the first cavity and the support edge 312 may be formed by the second cavity during injection molding, so as to produce the mask 3. Producing the mask 3 by injection molding can improve producing efficiency and reduce producing costs.

The Second Embodiment

In this embodiment, as shown in FIGS. 1-2, a display screen including an LED display module is provided. The LED display module includes a substrate 1, a plurality of LED emitting units 2, a mask 3 and a polarizer 4. The plurality of LED emitting units 2 is arranged at a side of the substrate 1, the mask 3 includes a plurality of grid units 31 mounted around the plurality of LED emitting units 2, respectively, and the polarizer 4 includes first polarizers 41 and second polarizers 42. Light emitted by the LED emitting unit 2 passes through the first polarizer 41 to form a first polarized light, or passes through the second polarizer 42 to form a second polarized light. Each grid unit 31 is attached with the first polarizer 41 or the second polarizer 42. Each first polarizer 41 is at least neighboring to one of the second polarizers 42, and each second polarizer 42 is at least neighboring to one of the first polarizers 41.

In this embodiment, the polarizer 4 adopts a non-integral design, with the first polarizers 41 and the second polarizers 42 corresponding to the grid units 31, which can better ensure the polarizing effect and reduce the use of polarizing materials to reduce material costs.

A side of the grid unit 31 away from the substrate 1 is provided with a flat support plane, and the first polarizer 41 or the second polarizer 42 is attached onto the support plane. The support plane of each grid unit 31 may be separately attached with the first polarizer 41 or the second polarizer 42. In some embodiments, the first polarizers 41 and the second polarizers 42 are arranged alternately in first and second directions, wherein the first direction is perpendicular to the second direction. That is, the first polarizers 41 and the second polarizers 42 each are grid-shaped, corresponding to the LED emitting unit 2. The first polarizers 41 and the second polarizers 42 may both be rectangular-shaped or square-shaped, with the second polarizers 42 arranged at four lateral sides of each first polarizer 41 and the first polarizers 41 arranged at four lateral sides of each second polarizer 42. In some embodiments, the first polarizers 41 are continuously arranged in the first direction, the second polarizers 42 are continuously arranged in the first direction, and the first polarizers 41 and the second polarizers 42 are alternately arranged in the second direction. In this embodiment, when the first polarizer 41 and the second polarizer 42 both are linear polarizers, the polarization directions of the first polarizer 41 and the second polarizer 42 are perpendicular to each other; when the first polarizer 41 and the second polarizer 42 are circular polarizers, the first polarizer 41 and the second polarizer 42 may be left circularly polarized and right circularly polarized, respectively.

The grid units 31 include multiple rows, specifically are arranged as a rectangular array. The grid units 31 include multiple rows, and the first polarizers 41 and the second polarizers 42 both are strip-shaped. The support planes of the grid units 31 in a same row are adhered with the first polarizer 41 or the second polarizer 42, and the first polarizers 41 and the second polarizers 42 are alternately arranged in a width direction. That is, the first polarizers 41 and the second polarizers 42 each are strip-shaped. The first polarizers 41 and the second polarizers 42 may extend in the longitudinal direction, and be arranged alternately in the lateral direction. When the first polarizers 41 and the second polarizers 42 extend in the lateral direction, the first polarizers 41 and the second polarizers 42 may be arranged alternately in the longitudinal direction.

The polarizer 4 is a linear polarizer, and the first polarizer 41 and the second polarizer 42 are reflective polarizers with reflective surfaces thereof facing towards the LED emitting units 2. The use of reflective polarizers can improve the light output efficiency and enhance the display effect.

The retaining walls 311 are formed separately or integrally. Specifically, when the retaining walls 311 are formed separately, each LED emitting unit 2 corresponds to a separate retaining wall 311. During assembly, each LED emitting unit 2 is equipped with a retaining wall 311 therearound, and the retaining walls 311 corresponding to neighboring LED emitting units 2 abut each other. When the retaining walls 311 are formed integrally, neighboring retaining walls 311 are connected integrally as one piece. In this way, the mask 3 is an integral structure. As long as the mask 3 is positioned with the substrate 1, each of the retaining walls 311 may be mounted around one corresponding LED emitting unit 2 to ensure the accuracy of the position, which is more convenient and efficient for assembly, thereby improving assembly efficiency.

In this embodiment, a periphery of a side of the retaining wall 311 away from the substrate 1 extends inwardly to form the support edge 312, and the support edge 312 of the same grid unit 31 forms an annular structure. Specifically, in the present application, the retaining wall 311 is a square ring structure. Correspondingly, the support edge 312 is also a square ring structure and extends inwardly. In some embodiments, according to actual shapes of the first polarizer 41 and the second polarizer 42, the retaining wall 311 may be a rectangular ring structure, and correspondingly the support edge 312 is a rectangular ring structure too; or, the retaining wall 311 may be a circular ring structure, and correspondingly the support edge 312 is a circular ring structure too. Further, the support edge 312 is coaxial with the retaining wall 311. The shape of the retaining wall 311 and the shape of support edge 312 may be set adaptively according to actual situation, which are not restricted here.

The retaining wall 311 and the support edge 312 may be formed separately or connected integrally. Specifically, when the retaining wall 311 and the support edge 312 are formed separately, it means that the retaining wall 311 and the support edge 312 are separate structures, which can be divided into several situations, for example:

1. all of the retaining walls 311 are connected integrally, and all of the support edges 312 are connected integrally and correspond to positions of the retaining walls 311 one by one. During assembly, the support edges 312 are covered on a side of the retaining walls 311 away from the substrate 1 and positioned, so as to ensure the corresponding relationship between all of the support edges 312 and retaining walls 311, so that assembly is convenient and fast.

2. all of the retaining walls 311 are separate structures, and all of the support edges 312 are separate structures. In this case, the support edges 312 need to be assembled to the retaining walls 311 one by one.

3. all of the retaining walls 311 are separate structures, and all of the support edges 312 are connected integrally. Firstly, the retaining walls 311 are assembled to the substrate 1, and then the support edges 312 are assembled to the substrate 1, so as to make the support edges 312 correspond with the retaining walls 311.

When the retaining walls 311 and the support edges 312 are connected integrally, the setting method of separate or integral grid units 31 may be referred to, and the retaining walls 311 and the support edges 312 may be treated as a whole.

In this embodiment, the retaining wall 311 can block the light emitted by the LED emitting unit 2 from shining towards the neighboring LED emitting units 2, thereby preventing mutual interference between neighboring LED emitting units 2 and ensuring the display effect. In addition, the retaining walls 311 and the support edges 312 may cooperatively achieve the fixation and support of the polarizer 4, ensuring the reliability of the LED module.

In this embodiment, a side of the support edge 312 away from the substrate 1 is flat, and the polarizer 4 may be adhered to the support edge 312 through optical adhesive bonding, thereby achieving stable adhesion. In some embodiments, a positioning groove may be provided on the side of the support edge 312 away from the substrate 1, the support plane is located at a bottom of the positioning groove, and the polarizer 4 is attached into the positioning groove and may be flush with an opening of the positioning groove. In some embodiments, a limiting edge may protrude from the support plane of the support edge 312, a periphery of the first polarizer 41 or the second polarizer 42 abuts a lateral side of the limiting edge, and the first polarizer 41 or the second polarizer 42 may be flush with a top side of the limiting edge. By means of matching the first polarizer 41 or the second polarizer 42 with the positioning groove or the limiting edge, a position accuracy of the first polarizer 41 or the second polarizer 42 may be ensured when it is attached onto the support edge 312, and the position accuracy between the first polarizer 41 or the second polarizer 42 and the LED emitting unit 2 is improved, thereby improving the display quality of the LED module. During forming the positioning groove or the limiting edge, its shape and size may be set adaptively according to the shape, size, thickness, etc. of the first polarizer 41 or the second polarizer 42.

An inner face of the retaining wall 311 may be provided with reinforced ribs that are connected to the support edge 312. Specifically, the reinforced ribs may be arranged along a periphery of an open side of the retaining wall 311 adjacent to the support edge 312 and spaced from each other. Further, the reinforced ribs are perpendicular to the inner face of the retaining wall 311, and preferably, are evenly spaced from each other. The reinforced ribs may be triangular-shaped. When the retaining wall 311 and the support edge 312 are formed separately, the reinforcing ribs abut against an inner side of the support edge 312. When the retaining wall 311 and the support edge 312 are formed integrally, the reinforcing ribs are connected to the support edge 312 integrally.

In this embodiment, an injection mold is also provided for molding the mask 3 described above. The injection mold includes a first template and a second template. When the first template and the second template are combined, a mold cavity is formed therebetween. The mold cavity includes a first cavity and a second cavity. The first cavity matches with the retaining wall 311, and the second cavity communicates with the first cavity and matches with the support edge 312. By means of the above injection mold, the retaining wall 311 may be formed by the first cavity and the support edge 312 may be formed by the second cavity during injection molding, so as to produce the mask 3. Producing the mask 3 by injection molding can improve producing efficiency and reduce producing costs.

The Third Embodiment

Figure 3:
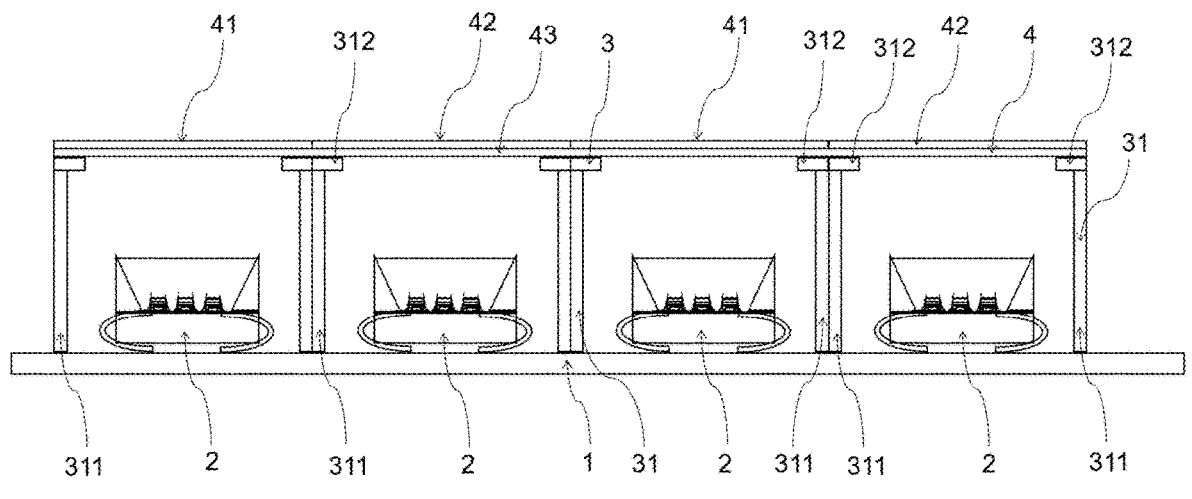
FIG. 3 is a schematic view of the LED module of the third embodiment of the present application.

In this embodiment, as shown in FIG. 3 and FIG. 2, a display screen is provided. The display screen includes an LED module, and the LED module includes a substrate 1, a plurality of LED emitting units 2, a mask 3 and a polarizer 4. The plurality of LED emitting units 2 is arranged at a side of the substrate 1, the mask 3 includes a plurality of grid units 31 mounted around the plurality of LED emitting units 2, respectively, and the polarizer 4 includes first polarizers 41, second polarizers 42 and a third polarizer 43, wherein the first polarizer 41 is first circular polarizer, the second polarizer 42 is second circular polarizer, and the third polarizer 43 is reflective polarizer with a reflective surface thereof facing towards the LED emitting units 2. A portion of a side of the reflective polarizer that is away from the LED emitting units 2 that corresponds to each of the grid units 31 is provided with the first polarizer 41 or the second polarizer 42. The first polarizer 41 and the second polarizer 42 are both circular polarizers with opposite polarization directions. Light emitted by the LED emitting unit 2 passes through the first polarizer 41 to form left circularly polarized light, or passes through the second polarizer 42 to form right circularly polarized light.

In this embodiment, the third polarizer 43 adopts a reflective polarizer. The first polarizer 41 and the second polarizer 42 can achieve the function of circular polarization, thereby improving the light output efficiency and display effect on the basis of achieving 3D display effect.

A side of the grid unit 31 away from the substrate 1 is provided with a flat support plane, the third polarizer 43 is attached onto the support plane, and the first polarizers 41 and the second polarizers 42 are attached onto the third polarizer 43. Each first polarizer 41 is at least neighboring to one of the second polarizers 42, and each second polarizer 42 is at least neighboring to one of the first polarizers 41. In some embodiments, the first polarizers 41 and the second polarizers 42 are arranged alternately in first and second directions, wherein the first direction is perpendicular to the second direction. That is, the first polarizers 41 and the second polarizers 42 each are grid-shaped, corresponding to the LED emitting unit 2. The first polarizers 41 and the second polarizers 42 may both be rectangular-shaped or square-shaped, with the second polarizers 42 arranged at four lateral sides of each first polarizer 41 and the first polarizers 41 arranged at four lateral sides of each second polarizer 42. In some embodiments, the first polarizers 41 are continuously arranged in the first direction, the second polarizers 42 are continuously arranged in the first direction, and the first polarizers 41 and the second polarizers 42 are alternately arranged in the second direction.

The grid units 31 include multiple rows, specifically are arranged as a rectangular array. The first polarizers 41 and the second polarizers 42 each are strip-shaped, a portion of the third polarizer 43 corresponding to the grid units 31 in a same row is attached with the first polarizer 41 or the second polarizer 42, and the first polarizers 41 and the second polarizers 42 are alternately arranged in a width direction. That is, the first polarizers 41 and the second polarizers 42 each are strip-shaped. The first polarizers 41 and the second polarizers 42 may extend in the longitudinal direction, and be arranged alternately in the lateral direction. When the first polarizers 41 and the second polarizers 42 both extend in the lateral direction, the first polarizers 41 and the second polarizers 42 may be arranged alternately in the longitudinal direction.

An inner face of the grid unit 31 and/or a side of the substrate 1 with the LED emitting units 2 are reflective surfaces. Specifically, the grid unit 31 may be made of reflective materials, such as aluminum alloy, titanium alloy, etc., and the inner face of grid unit 31 is a smooth surface. The inner face of grid unit 31 may be coated with reflective film or reflective paint, and the substrate 1 may also be coated with reflective film or reflective paint. Due to the third polarizer 43 adopts reflective polarizer, light emitted by the LED emitting unit 2 will be reflected again by the reflective surface of the grid unit 31 or the substrate 1 after being reflected by the third polarizer 43, thereby improving the utilization rate of light, further improving the light efficiency, and enhancing the display effect.

The retaining walls 311 are formed separately or integrally. Specifically, when the retaining walls 311 are formed separately, each LED emitting unit 2 corresponds to a separate retaining wall 311. During assembly, each LED emitting unit 2 is equipped with a retaining wall 311 therearound, and the retaining walls 311 corresponding to neighboring LED emitting units 2 abut each other. When the retaining walls 311 are formed integrally, neighboring retaining walls 311 are connected integrally as one piece. In this way, the mask 3 is an integral structure. As long as the mask 3 is positioned with the substrate 1, each of the retaining walls 311 may be mounted around one corresponding LED emitting unit 2 to ensure the accuracy of the position, which is more convenient and efficient for assembly, thereby improving assembly efficiency.

In this embodiment, a periphery of a side of the retaining wall 311 away from the substrate 1 extends inwardly to form the support edge 312, and the support edge 312 of the same grid unit 31 forms an annular structure. The third polarizer 43 may be adhered to the support edge 312 through optical adhesive bonding, thereby achieving stable adhesion. Specifically, in the present application, the retaining wall 311 is a square ring structure. Correspondingly, the support edge 312 is also a square ring structure and extends inwardly. In some embodiments, according to actual shapes of the first polarizer 41 and the second polarizer 42, the retaining wall 311 may be a rectangular ring structure, and correspondingly the support edge 312 is a rectangular ring structure too; or, the retaining wall 311 may be a circular ring structure, and correspondingly the support edge 312 is a circular ring too structure. Further, the support edge 312 is coaxial with the retaining wall 311. The shape of the retaining wall 311 and the shape of support edge 312 may be set adaptively according to actual situation, which are not restricted here.

The retaining wall 311 and the support edge 312 may be formed separately or connected integrally. Specifically, when the retaining wall 311 and the support edge 312 are formed separately, it means that the retaining wall 311 and the support edge 312 are separate structures, which can be divided into several situations, for example:

1. all of the retaining walls 311 are connected integrally, and all of the support edges 312 are connected integrally and correspond to positions of the retaining walls 311 one by one. During assembly, the support edges 312 are covered on a side of the retaining walls 311 away from the substrate 1 and positioned, so as to ensure the corresponding relationship between all of the support edges 312 and retaining walls 311, so that assembly is convenient and fast.

2. all of the retaining walls 311 are separate structures, and all of the support edges 312 are separate structures. In this case, the support edges 312 need to be assembled to the retaining walls 311 one by one.

3. all of the retaining walls 311 are separate structures, and all of the support edges 312 are connected integrally. Firstly, the retaining walls 311 are assembled to the substrate 1, and then the support edges 312 are assembled to the substrate 1, so as to make the support edges 312 correspond with the retaining walls 311.

When the retaining walls 311 and the support edges 312 are connected integrally, the setting method of separate or integral grid units 31 may be referred to, and the retaining walls 311 and the support edges 312 may be treated as a whole.

In this embodiment, a face of the retaining wall 311 is reflective surface, and the retaining wall 311 can block the light emitted by the LED emitting unit 2 from shining towards neighboring LED emitting units 2, thereby preventing mutual interference between neighboring LED emitting units 2 and ensuring the display effect. In addition, the retaining walls 311 and the support edges 312 may cooperatively achieve the fixation and support of the third polarizer 43, ensuring the reliability of the LED module.

An inner face of the retaining wall 311 may be provided with reinforced ribs that are connected to the support edge 312. Specifically, the reinforced ribs may be arranged along a periphery of an opening side of the retaining wall 311 adjacent to the support edge 312 and spaced from each other. Further, the reinforced ribs are perpendicular to the inner face of the retaining wall 311, and, preferably, are evenly spaced from each other. The reinforced ribs may be triangular-shaped. When the retaining wall 311 and the support edge 312 are formed separately, the reinforcing ribs abut against an inner side of the support edge 312. When the retaining wall 311 and the support edge 312 are formed integrally, the reinforcing ribs are connected to the support edge 312 integrally.

In this embodiment, an injection mold is also provided for molding the mask 3 described above. The injection mold includes a first template and a second template. When the first template and the second template are combined, a mold cavity is formed therebetween. The mold cavity includes a first cavity and a second cavity. The first cavity matches with the retaining wall 311, and the second cavity communicates with the first cavity and matches with the support edge 312. By means of the above injection mold, the retaining wall 311 may be formed by the first cavity and the support edge 312 may be formed by the second cavity during injection molding, so as to produce the mask 3. Producing the mask 3 by injection molding can improve producing efficiency and reduce producing costs.

The above is only preferred embodiments of the present application, which is not intended to limit the present application. Any modifications, equivalent substitutions, and improvements made without departing from the spirit and principles of the present application should be within the scope of protection of this application.

What is claimed is:

1. An LED module comprising a substrate, a plurality of LED emitting units, a mask and a polarizer, the plurality of LED emitting units being provided at a side of the substrate, the mask being integrally in a grid structure and comprising a plurality of grid units mounted around the plurality of LED emitting units, respectively, each of the plurality of grid units being enclosed by a retaining wall, one end of the retaining wall away from the substrate extending outwards along a direction close to a center of the grid unit to form a support edge, an outer side of the support edge being provided with a support plane;

the polarizer comprising first circular polarizers, second circular polarizers and a third polarizer, the third polarizer being a reflective polarizer with a reflective surface thereof facing towards the plurality of LED emitting units, a portion of a side of the reflective polarizer that is away from the plurality of LED emitting units corresponding to each of the plurality of LED emitting units being individually provided with the first circular polarizer or the second circular polarizer, wherein the third polarizer is configured to perform polarization reflection on light emitted by the LED emitting units;

the first circular polarizers and the second circular polarizers being circular polarizers and being opposite in polarization directions, wherein the light emitted by the LED emitting units is transmitted through the third polarizer, is then incident on the first circular polarizers or the second circular polarizers, and is converted into left circularly polarized light or right circularly polarized light by the first circular polarizers or the second circular polarizers.

2. The LED module according to claim 1, wherein the first circular polarizers and the second circular polarizers are attached onto the reflective polarizer.

3. The LED module according to claim 2, wherein the first circular polarizers and the second circular polarizers are alternately arranged in first and second directions, and the first direction is perpendicular to the second direction; or wherein the first circular polarizers are continuously arranged in a first direction, the second circular polarizers are continuously arranged in the first direction, and the first circular polarizers and the second circular polarizers are alternately arranged in a second direction.

4. The LED module according to claim 1, wherein each of the first circular polarizers is neighboring to at least one of the second circular polarizers, and each of the second circular polarizers is neighboring to at least one of the first circular polarizers.

5. The LED module according to claim 1, wherein the plurality of grid units comprises multiple rows of grid units, the first polarizers and the second polarizers are strip-shaped, a portion of the third polarizer corresponding to the grid units in a same row is attached with the first circular polarizer or the second circular polarizer, and the first circular polarizers and the second circular polarizers are alternately arranged in a width direction.

6. The LED module according to claim 1, wherein the support plane is a flat support plane, and the third polarizer is attached onto the support plane; or wherein an inner face of the grid unit or a side of the substrate on which the LED emitting units are arranged is a reflective surface, and the light emitted by the LED emitting units is reflected again by the reflective surface of the grid unit or the substrate after being reflected by the third polarizer;

wherein the support planes at outer sides of the support edges of the plurality of grid units are located in a same plane; or wherein the supporting edge of each of the plurality of grid units is an annular structure; or wherein a cross-section of the grid unit is square-shaped;

wherein a projection area of the support edge of each grid unit is less than 20% of an area of the corresponding grid unit;

wherein an inner face of the retaining wall is provided with reinforced ribs connected to the support edge, the reinforced ribs are arranged along a periphery of an opening side of the retaining wall adjacent to the support edge and spaced from each other, and the reinforced ribs are perpendicular to the inner face of the retaining wall; and wherein when the retaining wall and the support edge are formed separately, the reinforcing ribs abut against an inner side of the support edge; and when the retaining wall and the support edge are formed integrally, the reinforcing ribs are connected to the support edge integrally.

* * * * *